(12) United States Patent
Yuan et al.

(10) Patent No.: US 11,328,785 B2
(45) Date of Patent: May 10, 2022

(54) SHIFT REGISTER, GATE DRIVING CIRCUIT AND GATE DRIVING METHOD

(71) Applicants: HEFEI BOE JOINT TECHNOLOGY CO., LTD., Anhui (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/104,809

(22) Filed: Nov. 25, 2020

(65) Prior Publication Data
US 2021/0343357 A1    Nov. 4, 2021

Related U.S. Application Data

(63) Continuation-in-part of application No. PCT/CN2020/087988, filed on Apr. 30, 2020.

(51) Int. Cl.
*G11C 19/00* (2006.01)
*G11C 19/28* (2006.01)
*G09G 3/20* (2006.01)

(52) U.S. Cl.
CPC ............ *G11C 19/285* (2013.01); *G09G 3/20* (2013.01); *G11C 19/28* (2013.01); *G11C 19/287* (2013.01); *G09G 2310/0286* (2013.01)

(58) Field of Classification Search
None
See application file for complete search history.

(56) References Cited

U.S. PATENT DOCUMENTS

| 8,442,621 | B2 * | 5/2013 | Gorek | A61B 17/7091 600/424 |
|---|---|---|---|---|
| 2004/0150449 | A1 * | 8/2004 | Durham | H03K 3/012 327/202 |
| 2014/0055444 | A1 * | 2/2014 | Jang | G09G 3/3266 345/213 |
| 2014/0140468 | A1 * | 5/2014 | Cheng | G11C 19/28 377/68 |

(Continued)

*Primary Examiner* — Tuan T Lam
(74) *Attorney, Agent, or Firm* — Nath, Goldberg & Meyer; Joshua B. Goldberg

(57) ABSTRACT

Shift register includes signal writing circuit, voltage control circuit and output circuit. The signal writing circuit is configured to write inverted signal of input signal provided by signal input terminal into second node responsive to control of second clock signal provided by second clock signal terminal. The voltage control circuit is configured to write first operating voltage into first node and write second clock signal into third node in voltage control circuit in response to control of voltage at first node, write second operating voltage into third node in response to control of second clock signal and write first clock signal provided by first clock signal terminal into first node in response to control of voltage at third node and first clock signal. The output circuit is configured to write second or first operating voltage into signal output terminal in response to control of voltage at first or second node.

12 Claims, 10 Drawing Sheets

(56) References Cited

U.S. PATENT DOCUMENTS

| | | | |
|---|---|---|---|
| 2017/0004771 A1* | 1/2017 | Lee | G09G 3/3266 |
| 2017/0116920 A1* | 4/2017 | Kwon | G09G 3/3266 |
| 2017/0200418 A1* | 7/2017 | Zhang | G11C 19/28 |
| 2017/0278450 A1* | 9/2017 | Ma | G09G 3/3648 |
| 2017/0287395 A1* | 10/2017 | Jang | G09G 3/3291 |
| 2017/0345366 A1* | 11/2017 | Jang | G09G 3/3674 |
| 2018/0130541 A1* | 5/2018 | Li | G11C 19/184 |
| 2018/0211716 A1* | 7/2018 | Ma | G09G 3/20 |
| 2020/0105205 A1* | 4/2020 | Woo | G09G 3/3258 |
| 2020/0175913 A1* | 6/2020 | Kang | G09G 3/3266 |

* cited by examiner

SHIFT REGISTER, GATE DRIVING CIRCUIT AND GATE DRIVING METHOD

TECHNICAL FIELD

The present disclosure relates to the display field, and in particular, to a shift register, a gate driving circuit, and a gate driving method.

BACKGROUND

In the existing art, a Gate Driver on Array (GOA) technology is adopted to integrate a Thin Film Transistor (TFT) switch circuit on an array substrate of a display panel to form a scan drive for the display panel, so as to save the part of a gate driver IC. The GOA circuit is composed of a plurality of cascaded shift registers.

The display panel includes a plurality of pixel units, each pixel unit is provided with a pixel circuit therein, and the driving transistor in the pixel circuit is often internally compensated for threshold voltage offset of the driving transistors in the pixel circuit. As time goes by, the electrical characteristics of the driving transistor may change (e.g., an amount of the threshold voltage offset may change), the corresponding internal compensation lime also needs to change, and the effective pulse width of the scan driving signal required by the circuit for internal compensation in the pixel circuit also needs to change. Therefore, in order to ensure the internal compensation to be performed normally, the pulse width of the scan driving signal output by the GOA circuit needs to be adjustable.

SUMMARY

To solve at least one of the problems in the existing art, the present disclosure provides a shift register, a gate driving circuit and a gate driving method.

In a first aspect, an embodiment of the present disclosure provides a shift register, including a signal writing circuit, a voltage control circuit, and an output circuit, the signal writing circuit, the voltage control circuit and the output circuit being coupled to a second node, and the voltage control circuit and the output circuit being coupled to a first node. The signal writing circuit is configured to write an inverted signal of an input signal provided by a signal input terminal into the second node in response to a control of a second clock signal provided by a second clock signal terminal. The voltage control circuit is configured to write a first operating voltage provided by a first power supply terminal into the first node and to write the second clock signal into a third node in the voltage control circuit in response to a control of a voltage at the second node, to write a second operating voltage provided by a second power supply terminal into the third node in response to a control of the second clock signal, and to write a first clock signal provided by a first clock signal terminal into the first node in response to a control of a voltage at the third node and the first clock signal. The output circuit is configured to write the second operating voltage into the signal output terminal in response to a control of a voltage at the first node, and to write the first operating voltage into the signal output terminal in response to the control of the voltage at the second node.

In some embodiments, the signal writing circuit includes an inverter circuit and a write control circuit. The inverter circuit is coupled to the signal input terminal, and is configured to invert the input signal provided by the signal input terminal and output the inverted signal. The write control circuit is coupled to the inverter circuit, and is configured to write the inverted signal to the second node in response to the control of the second clock signal.

In some embodiments, the inverter circuit includes a first transistor, a second transistor, a third transistor, and a fourth transistor. A control electrode and a first electrode of the first transistor are coupled to the second power supply terminal, and a second electrode of the first transistor is coupled to a control electrode of the second transistor and a first electrode of the third transistor. A first electrode of the second transistor is coupled to the second power supply terminal, and a second electrode of the second transistor is coupled to a first electrode of the fourth transistor. A control electrode of the third transistor is coupled to the signal input terminal, and a second electrode of the third transistor is coupled to the first power supply terminal. A control electrode of the fourth transistor is coupled to the signal input terminal, a first electrode of the fourth transistor is coupled to the write control circuit, and a second electrode of the fourth transistor is coupled to the third power supply terminal.

In some embodiments, the write control circuit includes a fifth transistor. A control electrode of the fifth transistor is coupled to the second clock signal terminal, a first electrode of the fifth transistor is coupled to the inverter circuit, and a second electrode of the fifth transistor is coupled to the second node.

In some embodiments, the voltage control circuit includes a first control circuit and a second control circuit. The first control circuit is coupled to the second node and the third node, and is configured to write the second clock signal into the third node in the voltage control circuit in response to the control of the voltage at the second node, and to write the second operating voltage provided by the second power supply terminal into the third node in response to the control of the second clock signal. The second control circuit is coupled to the third node and the first node, and is configured to write the first operating voltage into the first node in response to the control of the voltage at the first node, and to write the first clock signal into the first node in response to the control of the voltage at the third node and the first clock signal.

In some embodiments, the first control circuit includes a sixth transistor and a seventh transistor. A control electrode of the sixth transistor is coupled to the second node, a first electrode of the sixth transistor is coupled to the second clock signal terminal, and a second electrode of the sixth transistor is coupled to the third node. A control electrode of the seventh transistor is coupled to the second clock signal terminal, a first electrode of the seventh transistor is coupled to the third node, and a second electrode of the seventh transistor is coupled to the second power supply terminal.

In some embodiments, the second control circuit includes a first capacitor, an eighth transistor, a ninth transistor, and a tenth transistor. A first terminal of the first capacitor is coupled to a control electrode of the eighth transistor, and a second terminal of the first capacitor is coupled to the first electrode of the eighth transistor and a second electrode of the ninth transistor. A second electrode of the eighth transistor is coupled to the first clock signal terminal. A control electrode of the ninth transistor is coupled to the first clock signal terminal, and a first electrode of the ninth transistor is coupled to the first node. A control electrode of the tenth transistor is coupled to the second node, and a first electrode of the tenth transistor is coupled to the first power supply terminal.

In some embodiments, the shift register further includes a regulator circuit. The regulator circuit is coupled to the second node and the third node, and is configured to write a third operating voltage provided by a third power supply terminal into the second node in response to the control of the voltage at the third node and the first clock signal.

In some embodiments, the regulator circuit includes an eleventh transistor and a twelfth transistor. A control electrode of the eleventh transistor is coupled to the third node, a first electrode of the eleventh transistor is coupled to the third power supply terminal, and a second electrode of the eleventh transistor is coupled to a first electrode of the twelfth transistor. A control electrode of the twelfth transistor is coupled to the first clock signal terminal, and a second electrode of the twelfth transistor is coupled to the second node.

In some embodiments, the output circuit includes a thirteenth transistor and a fourteenth transistor. A control electrode of the thirteenth transistor is coupled to the first node, a first electrode of the thirteenth transistor is coupled to the second power supply terminal, and a second electrode of the thirteenth transistor is coupled to the signal output terminal. A control electrode of the fourteenth transistor is coupled to the second node, a first electrode of the fourteenth transistor is coupled to the signal output terminal, and a second electrode of the fourteenth transistor is coupled to the first power supply terminal.

In some embodiments, the output circuit further includes a second capacitor and a third capacitor. A first terminal of the second capacitor is coupled to the first node, and a second terminal of the second capacitor is coupled to the second power supply terminal. A first terminal of the third capacitor is coupled to the second node, and a second terminal of the third capacitor is coupled to the first power supply terminal.

In some embodiments, all transistors in the shift register are N-type transistors; or all transistors in the shift register are P-type transistors.

In some embodiments, the regulator circuit includes an eleventh transistor and a twelfth transistor. A control electrode of the eleventh transistor is coupled to the third node, a first electrode of the eleventh transistor is coupled to the second node, and a second electrode of the eleventh transistor is coupled to a first electrode of the twelfth transistor. A control electrode of the twelfth transistor is coupled to the first clock signal terminal, and a second electrode of the twelfth transistor is coupled to the third power supply terminal.

In some embodiments, the first power supply terminal and the third power supply terminal are a same power supply terminal.

In some embodiments, the first power supply terminal and the third power supply terminal are a same power supply terminal, and the first operating voltage and the third operating voltage are a same voltage.

In a second aspect, an embodiment of the present disclosure provides a gate driving circuit, including a plurality of cascaded shift registers, each of the plurality of cascaded shift registers being the shift register provided in the above first aspect. The signal input terminal of any of other stages of shift registers than a first stage of shift register among the plurality of cascaded shift registers is coupled to the signal output terminal of a previous stage of shift register.

In a third aspect, an embodiment of the present disclosure provides a gate driving method. The gate driving method is based on the shift register provided in the above first aspect, and the gate driving method includes in an output preparation stage, inverting the input signal in an active level state by the signal writing circuit in response to the control of the second clock signal, writing, by the signal writing circuit, a generated inverted signal in an inactive level state into the second node, and writing, by the voltage control circuit, the second operating voltage into the third node in response to the control of the second clock signal; in a continuous-output stage including at least one continuous-output period which includes a first output sub-stage and a second output sub-stage in the first output sub-stage, writing, by the voltage control circuit, the first clock signal in an active level state into the first node in response to the control of the voltage at the third node and the first clock signal, and writing, by the output circuit, the second operating voltage into the signal output terminal in response to the control of the voltage at the first node; in the second output sub-stage, inverting the input signal in an active level state by the signal writing circuit in response to the control of the second clock signal, and writing, by the signal writing circuit, a generated inverted signal in an inactive level state into the second node, where the first node is in a floating state and the voltage at the first node is maintained in an active level state, in a final output stage, writing, by the voltage control circuit, the first clock signal in an active level state into the first node in response to the control of the voltage at the third node and the first clock signal, and writing, by the output circuit, the second operating voltage into the signal output terminal in response to the control of the voltage at the first node; and in a reset stage, inverting the input signal in an inactive level state by the signal writing circuit in response to the control of the second clock signal, and writing, by the signal writing circuit, a generated inverted signal in an active level state into the second node, writing, by the voltage control circuit, the first operating voltage into the first node in response to the control of the voltage at the second node, and writing, by the output circuit, the first operating voltage into the signal output terminal in response to the control of the voltage at the second node.

DETAILED DESCRIPTION

In order to make those skilled in the art better understand the technical solutions of the present disclosure, a shift register, a gate driving circuit, and a gate driving method provided in the present disclosure are described in detail below with reference to the accompanying drawings.

The transistors in the present disclosure may be thin film transistors or field effect transistors or other switching devices having the same characteristics. Transistors generally include three electrodes: a gate electrode, a source electrode and a drain electrode. The source electrode and the drain electrode in a transistor are symmetrical in structure, and the two electrodes are interchangeable as required. In the present disclosure, the control electrode refers to a gate electrode of the transistor, and one of the first electrode and the second electrode is a source electrode and the other is a drain electrode.

Further, transistors may be classified into N-type transistors and P-type transistors according to their characteristics. When the transistor is an N-type transistor, the turn-on voltage of the transistor is a high level voltage, and the turn-off voltage of the transistor is a low level voltage; and when the transistor is a P-type transistor, the turn-on voltage is a low level voltage and the turn-off voltage is a high level voltage. The "active level" in the present disclosure refers to a voltage capable of controlling the corresponding transistor to be turned on, and the "inactive level" refers to a voltage capable of controlling the corresponding transistor to be turned off. Thus, when the transistor is an N-type transistor, the active level refers to a high level, and the inactive level refers to a low level; and when the transistor is a P-type transistor, the active level refers to a low level and the inactive level refers to a high level.

In the present disclosure, the first operating voltage provided by the first power supply terminal is an inactive level voltage, the second operating voltage provided by the second power supply terminal is an active level voltage, and the third operating voltage provided by the third power supply terminal is an inactive level voltage.

In addition, "in response to a control of a certain signal voltage" described in the embodiments of the present disclosure refers to "in response to the control of the signal/voltage when the signal/voltage is in an active level state".

In the following description of the embodiments, the transistors are exemplified as being N-type transistors. In this case, the active level refers to a high level, and the inactive level refers to a low level. Those skilled in the art will appreciate that the transistors in the embodiments described below may also be replaced with P-type transistors.

Figure 1:
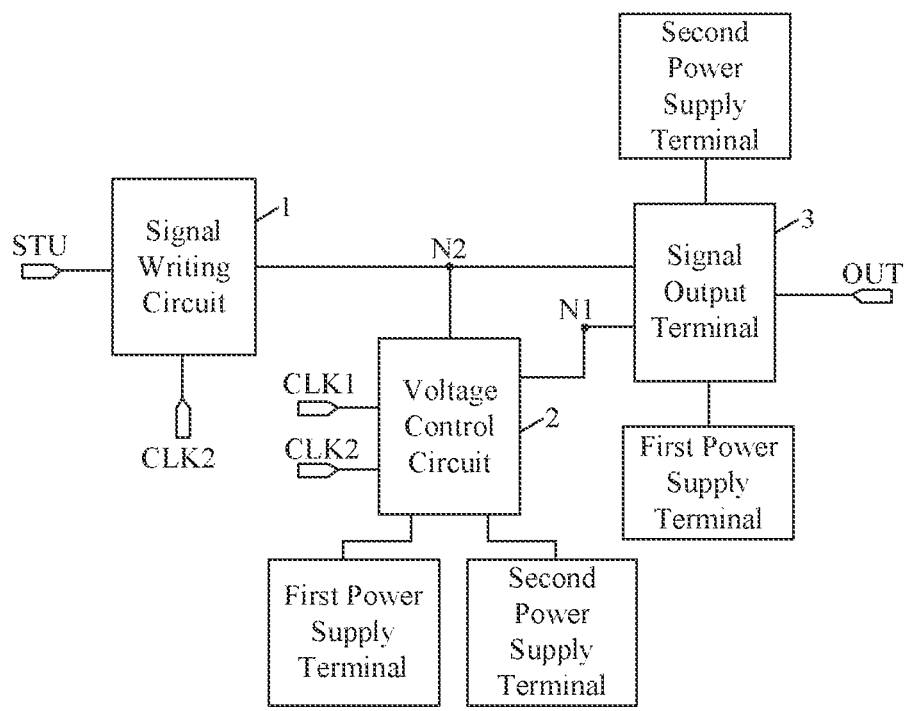
FIG. 1 is a schematic circuit diagram of a shift register according to an embodiment of the present disclosure.

FIG. 1 is a schematic circuit diagram of a shift register according to an embodiment of the present disclosure, and as shown in FIG. 1, the shift register includes a signal writing circuit 1, a voltage control circuit 2, and an output circuit 3. The voltage control circuit 2 and the output circuit 3 are coupled to a first node N1, and the signal writing circuit 1, the voltage control circuit 2 and the output circuit 3 are coupled to a second node N2.

The signal writing circuit 1 is configured to write an inverted signal of an input signal provided by a signal input terminal STU into the second node N2 in response to a control of a second clock signal provided by a second clock signal terminal CLK2.

The voltage control circuit 2 is configured to write a first operating voltage provided by a first power supply terminal into the first node N1 and write the second clock signal into a third node N3 in the voltage control circuit 2 in response to a control of a voltage at the first node N1, to write a second operating voltage provided by a second power supply terminal into the third node N3 in response to a control of the second clock signal, and to write a first clock signal provided by a first clock signal terminal CLK1 into the first node N1 in response to a control of a voltage at the third node N3 and the first clock signal.

The output circuit 3 is configured to write the second operating voltage into the signal output terminal OUT in response to the control of the voltage at the first node N1, and to write the first operating voltage into the signal output terminal OUT in response to a control of a voltage at the second node N2.

The operating process of the shift register provided by the embodiment of the present disclosure may include the following operating stages of an output preparation stage, a continuous-output stage, a final output stage, and a reset stage.

In the output preparation stage, the signal writing circuit 1 inverts the input signal in an active level state in response to a control of the second clock signal and writes the generated inverted signal in an inactive level state into the second node N2, and the voltage control circuit 2 writes the second operating voltage into the third node N3 in response to the control of the second clock signal. Meanwhile, the first node N1 is in a floating state, the voltage at the first node N1 is maintained in the previous inactive level state, the output circuit 3 does not write the first operating voltage and the second operating voltage into the signal output terminal OUT, and the voltage at the signal output terminal OUT is maintained in the previous inactive level state.

The continuous-output stage includes at least one continuous-output period, and the continuous-output period includes a first output sub-stage and a second output sub-stage.

In the first output sub-stage, the voltage control circuit 2 writes the first clock signal in an active level state into the first node N1 in response to the control of the voltage at the third node N3 and the first clock signal, and the output circuit 3 writes the second operating voltage into the signal output terminal OUT in response to the control of the voltage at the first node N1.

In the second output sub-stage, the signal writing circuit 1 inverts the input signal in an active level state in response to the control of the second clock signal, and writes the generated inverted signal in an inactive level state into the second node N2, the first node N1 is in the floating state, and the voltage at the first node N1 is maintained in the active level state.

In an embodiment of the present disclosure, the continuous-output stage may include an integer number of continuous-output periods. The number of the continuous-output periods included in the continuous-output stage is determined by the pulse width (the duration of the active level state in one frame) of the input signal provided by the signal input terminal STU, in the case where the cycles and the duty cycles (the ratio of the duration of the active level state to the clock cycle in one clock cycle) of the first clock signal and the second clock signal are constant. That is, the shift register provided by the embodiment of the present disclosure has adjustable duration of the operation in the continuous-output stage.

In the final output stage, the voltage control circuit 2 writes the first clock signal in an active level state into the first node N1 in response to the control of the voltage at the third node N3 and the first clock signal, and the output circuit 3 writes the second operating voltage into the signal output terminal in response to the control of the voltage at the first node N1.

In the reset stage, the signal writing circuit 1 inverts the input signal in an inactive level state in response to the control of the second clock signal and writes the generated inverted signal in an active level state into the second node N2, the voltage control circuit 2 writes the first operating voltage into the first node N1 in response to the control of the voltage at the second node N2, and the output circuit 3 writes the first operating voltage into the signal output terminal OUT in response to the control of the voltage at the second node N2.

In the embodiment of the present disclosure, the periods T and the duty cycles of the first clock signal provided by the first clock signal terminal CLK1 and the second clock signal provided by the second clock signal terminal are the same, where each duty cycle is equal to or less than 50% to avoid a case where the first clock signal and the second clock signal are both in an active level state simultaneously at a time, and the time when the first clock signal is in an active level state and the time when the second clock signal is in an active level state are set alternately, i.e. the first clock signal terminal CLK1 and the second clock signal terminal CLK2 output active pulses alternately. In this case, it can be considered that the waveform of the second clock signal lags behind the waveform of the first clock signal by T/2.

Therefore, the period in which the output of the shift register provided by the embodiment of the present disclosure is in an active level state starts from the starting time of the continuous-output stage and ends at the starting time of the reset stage. The duration of the continuous-output stage is adjustable, so that the total duration of the voltage in an active level state output by the shift register is also adjustable, namely the pulse width of the scan driving signal provided by the shift register to the gate line is adjustable, so as to adapt to the change of the internal compensation time of the pixel circuit.

Figure 2:
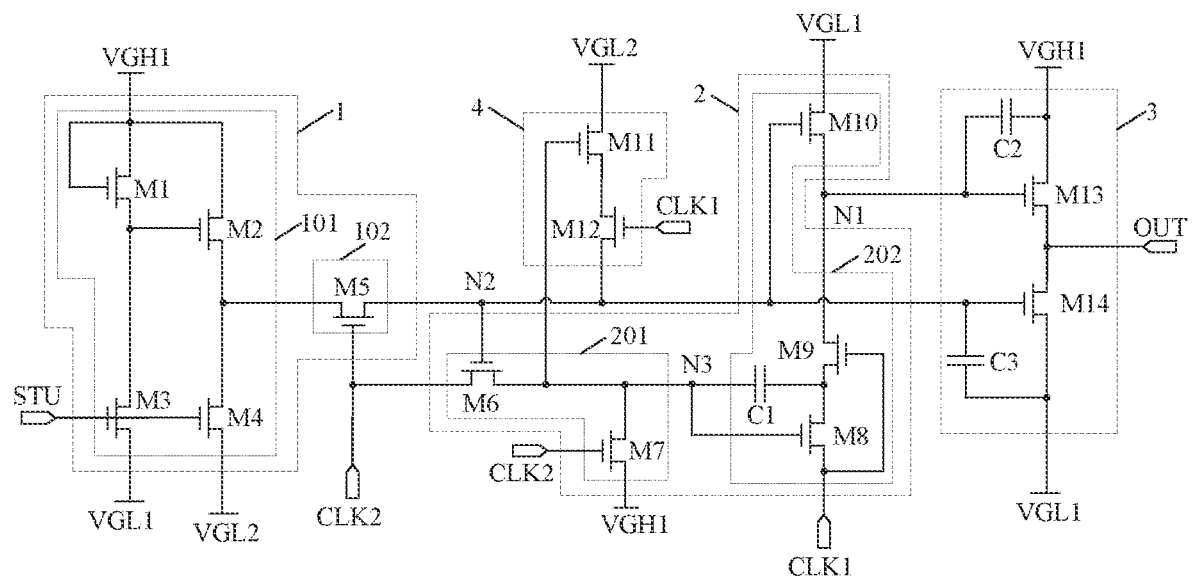
FIG. 2 is a schematic circuit diagram of another shift register according to an embodiment of the present disclosure.

FIG. 2 is a schematic circuit diagram of another shift register according to an embodiment of the present disclosure, and as shown in FIG. 2, the shift register shown in FIG. 2 is a specific embodiment of the shift register shown in FIG. 1.

In some embodiments, the signal writing circuit 1 includes: an inverter circuit 101 and a write control circuit 102. The inverter circuit 101 is coupled to the signal input terminal STU, and is configured to invert the input signal provided by the signal input terminal STU and output the inverted signal; and the write control circuit 102 is coupled to the inverter circuit 101, and is configured to write the inverted signal into the second node N2 in response to the control of the second clock signal.

In some embodiments, the inverter circuit 101 includes a first transistor M1, a second transistor M2, a third transistor M3, and a fourth transistor M4. A control electrode and a first electrode of the first transistor M1 are coupled to the second power supply terminal, and a second electrode of the first transistor M1 is coupled to a control electrode of the second transistor M2 and a first electrode of the third transistor M3; a first electrode of the second transistor M2 is coupled to the second power supply terminal, and a second electrode of the second transistor M2 is coupled to a first electrode of the fourth transistor M4; a control electrode of the third transistor M3 is coupled to the signal input terminal STU, and a second electrode of the third transistor M3 is coupled to the first power supply terminal; a control electrode of the fourth transistor M4 is coupled to the signal input terminal STU, a first electrode of the fourth transistor M4 is coupled to the write control circuit 102, and a second electrode of the fourth transistor M4 is coupled to the third power supply terminal.

In some embodiments, a width-to-length ratio of the third transistor M3 is greater than a width-to-length ratio of the first transistor M1. In some embodiments, the ratio of the width-to-length ratio of the third transistor M3 to the width-to-length ratio of the first transistor M1 is 2:1. In this way, it can be ensured that the second transistor M2 is turned off as expected during some time periods of an operating cycle.

In some embodiments, the write control circuit 102 includes a fifth transistor M5. A control electrode of the fifth transistor M5 is coupled to the second clock signal terminal CLK2, a first electrode of the fifth transistor M5 is coupled to the inverter circuit 101, and a second electrode of the fifth transistor M5 is coupled to the second node N2.

In some embodiments, the voltage control circuit 2 includes a first control circuit 201 and a second control circuit 202.

The first control circuit 201 is coupled to the second node N2 and the third node N3, and is configured to write the second clock signal into the third node N3 in the voltage control circuit 2 in response to the control of the voltage at the first node N1, and to write the second operating voltage provided by the second power supply terminal into the third node N3 in response to the control of the second clock signal.

The second control circuit 202 is coupled to the third node N3 and the first node N1, and is configured to write the first operating voltage into the first node N1 in response to the control of the voltage at the first node N1, and to write the first clock signal into the first node N1 in response to the control of the voltage at the third node N3 and the first clock signal.

In some embodiments, the first control circuit 201 includes a sixth transistor M6 and a seventh transistor M7. A control electrode of the sixth transistor M6 is coupled to the second node N2, a first electrode of the sixth transistor M6 is coupled to the second clock signal terminal CLK2, and a second electrode of the sixth transistor M6 is coupled to the third node N3; and a control electrode of the seventh transistor M7 is coupled to the second clock signal terminal CLK2, a first electrode of the seventh transistor M7 is coupled to the third node N3, and a second electrode of the seventh transistor M7 is coupled to the second power supply terminal.

In some embodiments, the second control circuit 202 includes a first capacitor C1, an eighth transistor M8, a ninth transistor M9, and a tenth transistor M10. A first terminal of the first capacitor C1 is coupled to a control electrode of the eighth transistor M8, and a second terminal of the first capacitor C1 is coupled to the first electrode of the eighth transistor and a second electrode of the ninth transistor M9; a second electrode of the eighth transistor M8 is coupled to the first clock signal terminal CLK1; a control electrode of the ninth transistor M9 is coupled to the first clock signal terminal CLK1, and a first electrode of the ninth transistor M9 is coupled to the first node N1, and a control electrode of the tenth transistor M10 is coupled to the second node N2, and a first electrode of the tenth transistor M10 is coupled to the first power supply terminal.

In some embodiments, the shifter register further includes a regulator circuit 4. The regulator circuit 4 is coupled to the second node N2 and the third node N3, and is configured to write a third operating voltage provided by a third power supply terminal into the second node N2 in response to the control of the voltage at the third node N3 and the first clock signal.

In some embodiments, the regulator circuit includes an eleventh transistor M11 and a twelfth transistor M12. A control electrode of the eleventh transistor M11 is coupled to the third node N3, a first electrode of the eleventh transistor M11 is coupled to the third power supply terminal, and a second electrode of the eleventh transistor M11 is coupled to a first electrode of the twelfth transistor M12, and a control electrode of the twelfth transistor M12 is coupled to the first clock signal terminal CLK1, and a second electrode of the twelfth transistor M12 is coupled to the second node N2.

Figure 9:
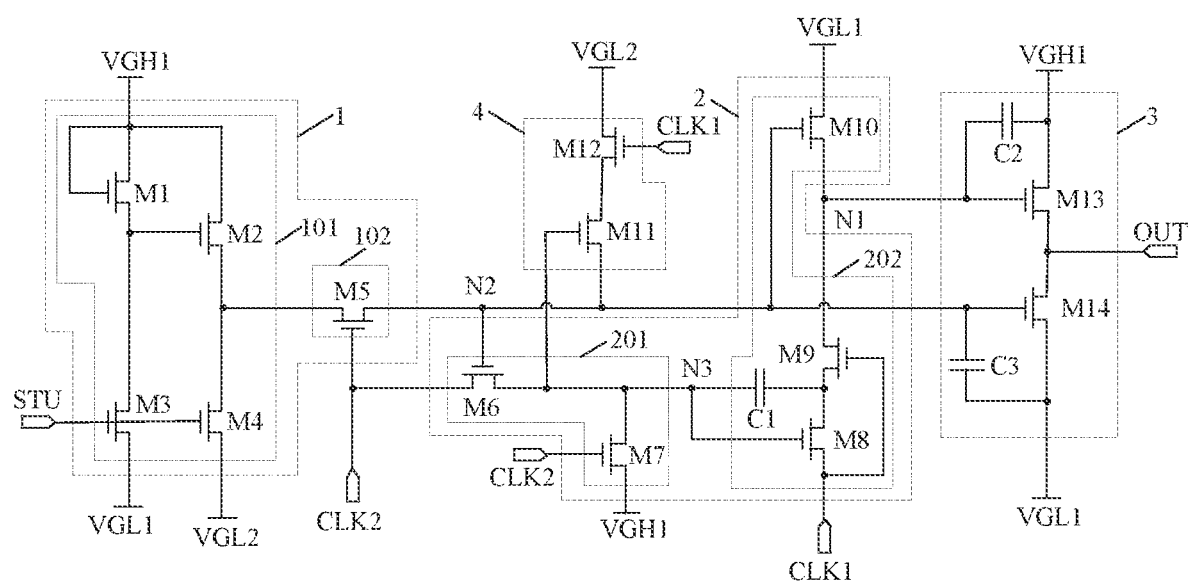
FIG. 9 is a schematic circuit diagram of a shift register according to an embodiment of the present disclosure.

In some embodiments, the regulator circuit 4 may also have another circuit structure. FIG. 9 is a schematic circuit diagram of a shift register according to an embodiment of the present disclosure, and the shift register shown in FIG. 9 is a specific embodiment of the shift register shown in FIG. 1. The circuit shown in FIG. 9 differs from that of FIG. 2 in the specific circuit structure of the regulator circuit 4. Referring to FIG. 9, the regulator circuit 4 includes an eleventh transistor M11 and a twelfth transistor M12. A control electrode of the eleventh transistor M11 is coupled to the third node N3, a first electrode of the eleventh transistor M11 is coupled to the second node N2, and a second electrode of the eleventh transistor M11 is coupled to a first electrode of the twelfth transistor M12, and a control electrode of the twelfth transistor M12 is coupled to the first clock signal terminal CLK1, and a second electrode of the twelfth transistor M12 is coupled to the third power supply terminal.

It should be noted that the regulator circuit 4 is not a necessary structure of the shift register provided by the present disclosure, and the regulator circuit 4 is configured to write the third operating voltage in an inactive level state into the second node N2 during certain stages, so as to maintain the voltage at the second node N2 in an inactive level state.

In some embodiments, the output circuit 3 includes a thirteenth transistor M13 and a fourteenth transistor M14. A control electrode of the thirteenth transistor M13 is coupled to the first node N1, a first electrode of the thirteenth transistor M13 is coupled to the second power supply terminal, and a second electrode of the thirteenth transistor M13 is coupled to the signal output terminal OUT. A control electrode of the fourteenth transistor M14 is coupled to the second node N2, a first electrode of the fourteenth transistor M14 is coupled to the signal output terminal OUT, and a second electrode of the fourteenth transistor M14 is coupled to the first power supply terminal.

In some embodiments, the output circuit 3 further includes a second capacitor C2 and a third capacitor C3; a first terminal of the second capacitor C2 is coupled to the first node N1, and a second terminal of the second capacitor C2 is coupled to the second power supply terminal; and a first terminal of the third capacitor C3 is coupled to the second node N2, and a second terminal of the third capacitor C3 is coupled to the first power supply terminal. By providing the second capacitor C2 and the third capacitor C3, the stability of the signal output from the signal output terminal OUT can be maintained.

Figure 3:
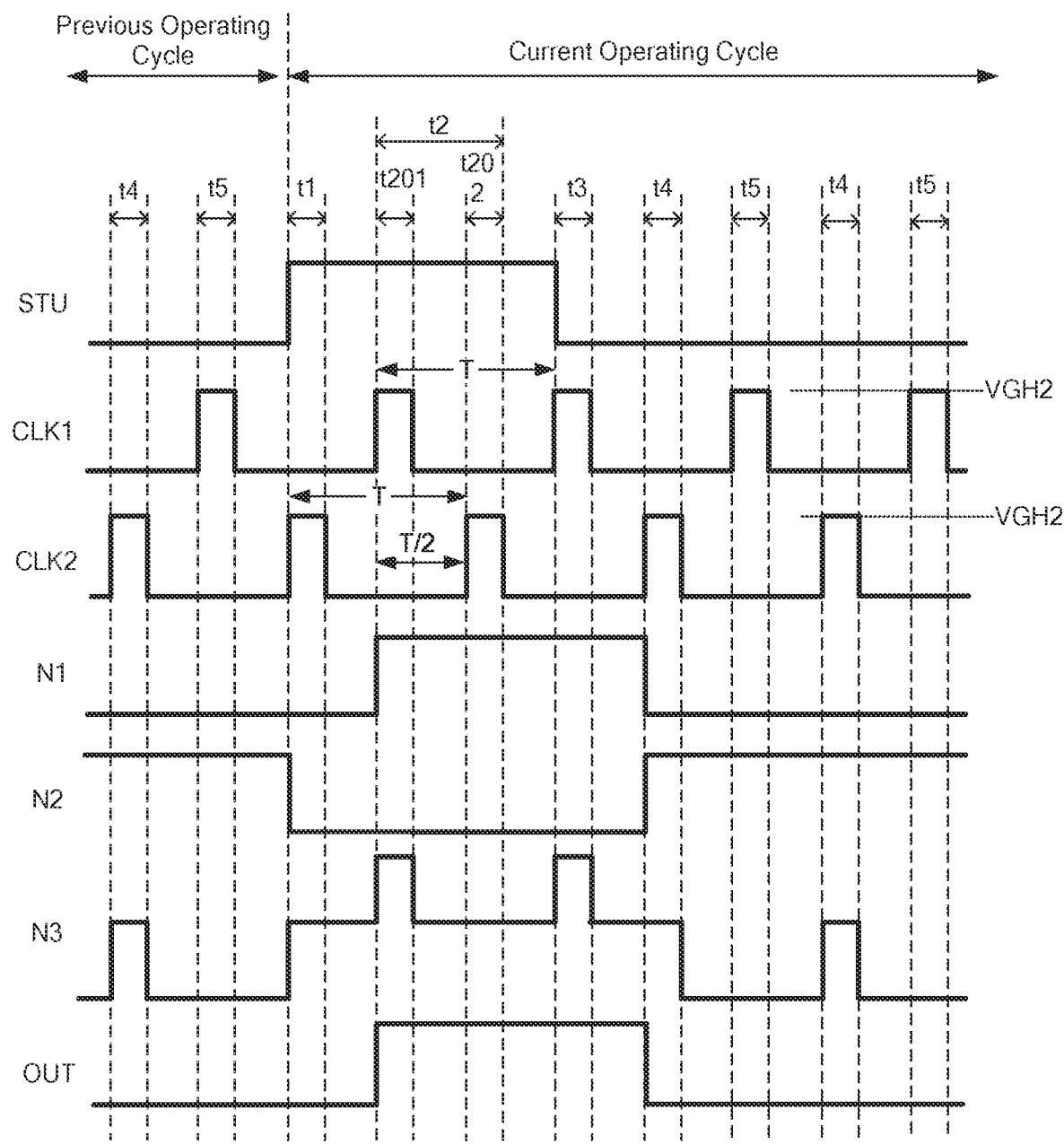
FIG. 3 is a timing diagram illustrating an operation of the shift register shown in FIG. 2.

FIG. 3 is a timing diagram illustrating an operation of the shift register shown in FIG. 2, and the operation of the shift register shown in FIG. 2 will be described in detail with reference to FIG. 3. The first operating voltage provided by the first power supply terminal is a low level voltage VGL1, the second operating voltage is a high level voltage VGH1, and the third operating voltage provided by the third power supply terminal is a low level voltage VGL2; and generally, VGL1 is slightly larger than VGL2. Each of the first clock signal and the second clock signal has a period T and a duty cycle that is less than 50%, and the waveform of the second clock signal lags behind the waveform of the first clock signal by T/2. It should be noted that, in the embodiment of the present disclosure, the duty cycle is set to be less than 50% in order to make a staggered time between the high level of the first clock signal and the high level of the second clock signal, and the amount of the staggered time may be set according to a resistance capacitance delay (RC Delay) in the circuit, where the longer the time of the RC Delay is, the longer the staggered time needs to be set.

In addition, in order to ensure that the voltage VGH2 of the first/second clock signals in a high level state can make the transistor with the first or second electrode coupled to the second power supply terminal (which provides the high level voltage VGH1) turn on. VGH2>VGH1 should be satisfied; and in general, the difference between VGH2 and VGH1 should be greater than the threshold voltage of the transistor. For example, in a case where the threshold voltage of each transistor is designed to be 2V, VGH1 may be designee to be 20V, and VGH2 may be designed to be 24V. In practical applications, the voltage levels of VGH1 and VGH2 may be adjusted according to actual needs.

It should be noted that, although in the above description and the drawings, the shift register is illustrated to include two power supply terminals of the first power supply terminal and the third power supply terminal for providing low level voltages and these two power supply terminals provide the low level voltages VGL1 and VGL2, respectively, the present disclosure is not limited thereto. In some embodiments, the shift register includes a single power supply terminal for providing a low level voltage VGL. For example, in some embodiments, the second electrode of the third transistor M3, the second electrode of the fourth transistor M4, the second electrode of the fourteenth transistor M14, the first electrode of the tenth transistor M10, and the first electrode of the eleventh transistor M11 (see FIG. 2) or the second electrode of the twelfth transistor M12 (see FIG. 9) may be coupled to one and the same power supply terminal for providing a low level voltage VGL. In some embodiments, in a case where the shift register includes an oxide N-type transistor, since the leakage of the oxide N-type transistor is large, the shift register according to the embodiments of the present disclosure may include the two power supply terminals of the first power supply terminal and the third power terminal for providing low level voltages. In some embodiments, in a case where the shift register includes a low-temperature polysilicon (LTPS) N-type transistor, since the leakage of the LTPS N-type transistor is small, the shift register according to the embodiments of the present disclosure may include only one power supply terminal for providing a low level voltage.

The operation of the shift register in one operating cycle may include the following stages of an output preparation stage t1, a continuous-output stage t2, a final output stage t3 and a reset stage t4.

In the output preparation stage t1, the input signal provided by the signal input terminal STU is in a high level state, the first clock signal provided by the first clock signal terminal CLK1 is in a low level state, and the second clock signal provided by the second clock signal terminal CLK2 is in a high level state.

Figure 4A:
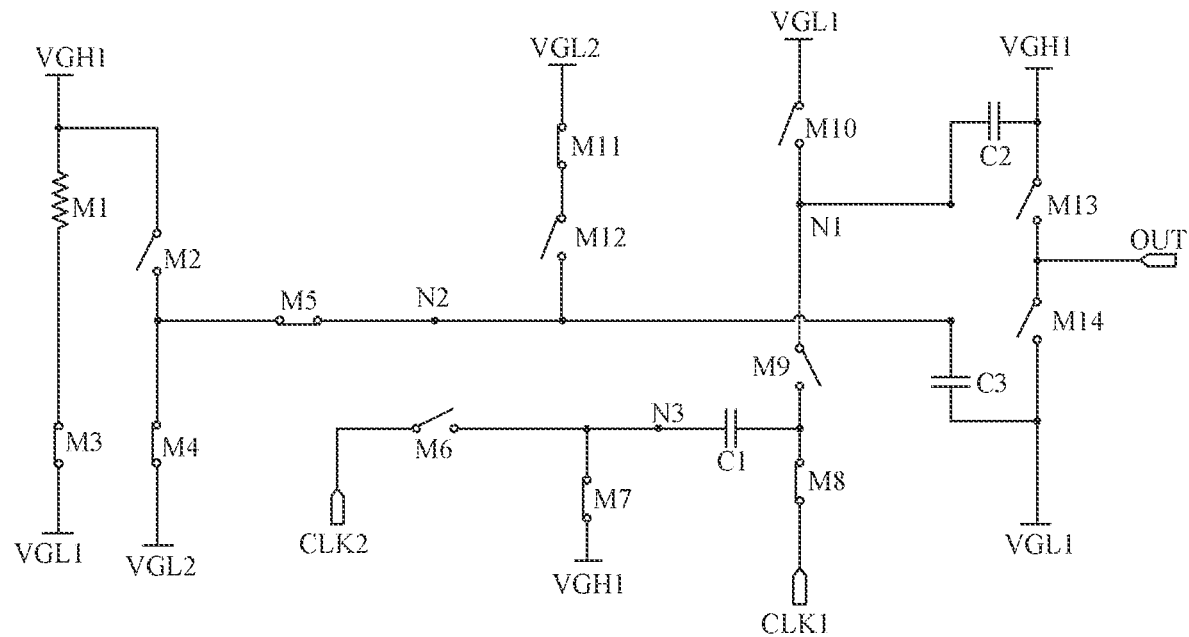
FIG. 4a is a schematic diagram of an equivalent circuit of the shift register shown in FIG. 2 when the shift register operates in an output preparation stage.

FIG. 4a is a schematic diagram of an equivalent circuit of the shift register shown in FIG. 2 when the shift register operates in the output preparation stage, and as shown in FIG. 4a, the third transistor M3, the fourth transistor M4, the fifth transistor M5, the seventh transistor M7, the eighth transistor M8, and the eleventh transistor M11 are all turned on, and the second transistor M2, the sixth transistor M6, the twelfth transistor M12, the ninth transistor M9, the tenth transistor M10, the thirteenth transistor M13, and the fourteenth transistor M14 are all turned off.

Since the input signal is in a high level state, the third transistor M3 and the fourth transistor M4 are turned on, and at this time, the first operating voltage VGL1 is written into the control electrode of the second transistor M2 through the third transistor M3, the second transistor M2 is in an off-state, and the first transistor M1 is equivalent to one resistor.

Since the second clock signal is in a high level state, the fifth transistor M5 and the seventh transistor M7 are turned on, the third operating voltage VGL2 can be written into the second node N2 through the fourth transistor M4 and the fifth transistor M5 in sequence, the voltage at the second node N2 is in a low level state, and the sixth transistor M6, the tenth transistor M10 and the fourteenth transistor M14 are all turned off. The second operating voltage VGH1 is written into the third node N3 through the seventh transistor M7, the voltage at the third node N3 is in a high level state, the eighth transistor M8 and the eleventh transistor M11 are in an on-state, and the first clock signal in a low level state is written into the second terminal of the first capacitor C1 through the eighth transistor M8. Meanwhile, since the first clock signal is in a low level state, the ninth transistor M9 and the twelfth transistor M12 are turned off.

The ninth transistor M9 and the tenth transistor M10 are turned off, the first node N1 is in a floating state, i.e., the voltage at the first node N1 is maintained in the previous low level state, and the thirteenth transistor M13 is turned off. Since both the thirteenth transistor M13 and the fourteenth transistor M14 are turned off, the voltage at the signal output terminal OUT is maintained in the previous low level state.

In a continuous-output stage t2, the continuous-output stage t2 includes at least one continuous-output period including one first output sub-stage t201 and one second output sub-stage t202; the case where the continuous-output stage t2 includes only one continuous-output period is exemplarily illustrated in FIG. 3, i.e., the entire continuous-output stage t2 includes only one first output sub-stage t201 and one second output sub-stage t202.

In the first output sub-stage t201, the input signal provided by the signal input terminal STU is in a high level state, the first clock signal provided by the first clock signal terminal CLK1 is in a high level state, and the second clock signal provided by the second clock signal terminal CLK2 is in a low level state.

Figure 4B:
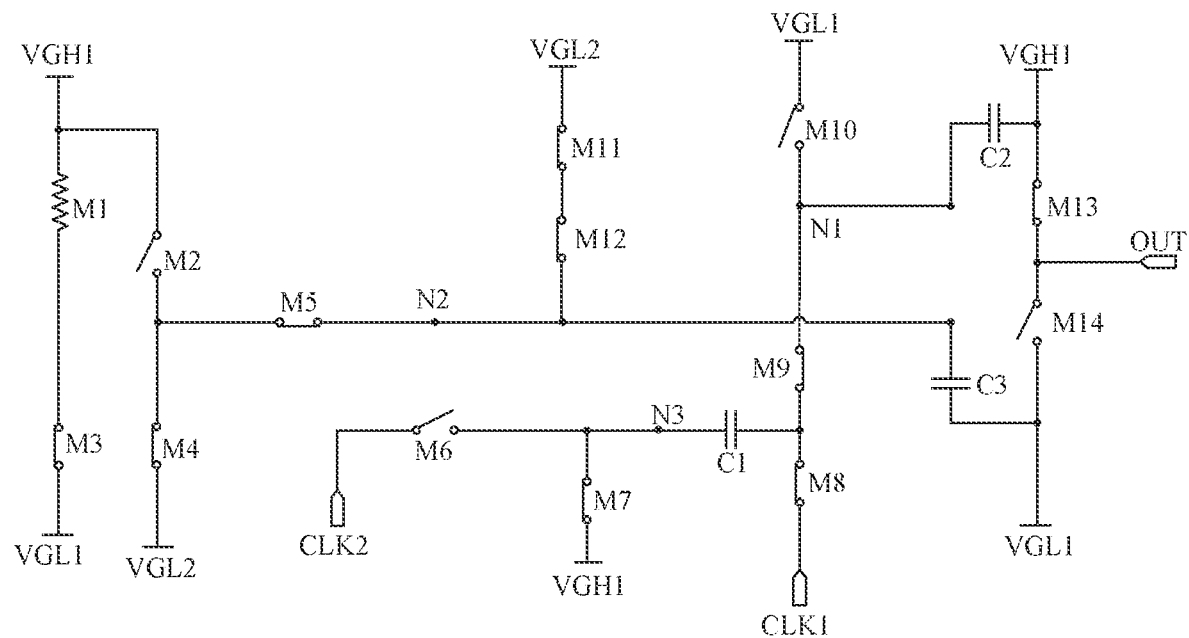
FIG. 4b is a schematic diagram of an equivalent circuit of the shift register shown in FIG. 2 when the shift register operates in a first output sub-stage.

FIG. 4b is a schematic diagram of an equivalent circuit of the shift register shown in FIG. 2 when the shift register operates in the first output sub-stage, and as shown in FIG. 4b, the third transistor M3, the fourth transistor M4, the eighth transistor M8, the ninth transistor M9, the eleventh transistor M11, the twelfth transistor M12, and the thirteenth transistor M13 are all turned on, and the second transistor M2, the fifth transistor M5, the sixth transistor M6, the seventh transistor M7, the tenth transistor M10, and the fourteenth transistor M14 are all turned off.

Since the input signal is in a high level state, the third transistor M3 and the fourth transistor M4 are turned on, and at this time, the first operating voltage VGL1 is written into the control electrode of the second transistor M2 through the third transistor M3, the second transistor M2 is in an off-state, and the first transistor M1 is equivalent to one resistor.

Since the second clock signal is in a low level state, the fifth transistor M5 and the seventh transistor M7 are turned off. The sixth transistor M6 is maintained in the off-state, the third node N3 is in a floating state, and the eighth transistor M8 and the eleventh transistor M11 are maintained in an on-state. Meanwhile, since the first clock signal is in a high level state, the ninth transistor M9 and the twelfth transistor M12 are turned on. Since the eleventh transistor M11 and the twelfth transistor M12 are turned on, the third operating voltage VGL2 is written into the second node N2 through the eleventh transistor M11 and the twelfth transistor M12, so as to maintain the second node N2 in a low level state all the time, thereby achieving the purpose of reducing noise for the second node N2. Since the eighth transistor M8 and the ninth transistor M9 are turned on, the first clock signal in a high level state is written into the second terminal of the first capacitor C1 through the eighth transistor M8, and is written into the first node N1 through the ninth transistor M9, and the voltage at the first node N1 is in a high level state.

It should be noted that, at the starting time of the first output sub-stage t201, the first clock signal is switched from a low level state to a high level state, the voltage at the second terminal of the first capacitor C1 is charged from a low level state to a high level state, and since the third node N3 is in a floating state, the voltage at the third node N3 is pulled up to a higher level under the bootstrap effect of the first capacitor C1; and at the end of the first output sub-stage t201, the first clock signal is switched from a high level state to a low level state, and the voltage at the second terminal of the first capacitor C1 is discharged from a high level state to a low level state, so that the voltage at the third node N3 is restored to the original level (which is still in a high level state but has a decreased voltage level) under the bootstrap effect of the first capacitor C1.

Since the voltage at the first node N1 is in a high level state, and the voltage at the second node N2 is in a low level state, the thirteenth transistor M13 is turned on, the fourteenth transistor M14 is turned off, the second operating voltage VGH1 is written into the signal output terminal OUT through the thirteenth transistor M13, and the signal output terminal OUT outputs a high level signal.

In the second output sub-stage t202, the input signal provided by the signal input terminal STU is in a high level state, the first clock signal provided by the first clock signal terminal CLK1 is in a low level state, and the second clock signal provided by the second clock signal terminal CLK2 is in a high level state.

Figure 4C:
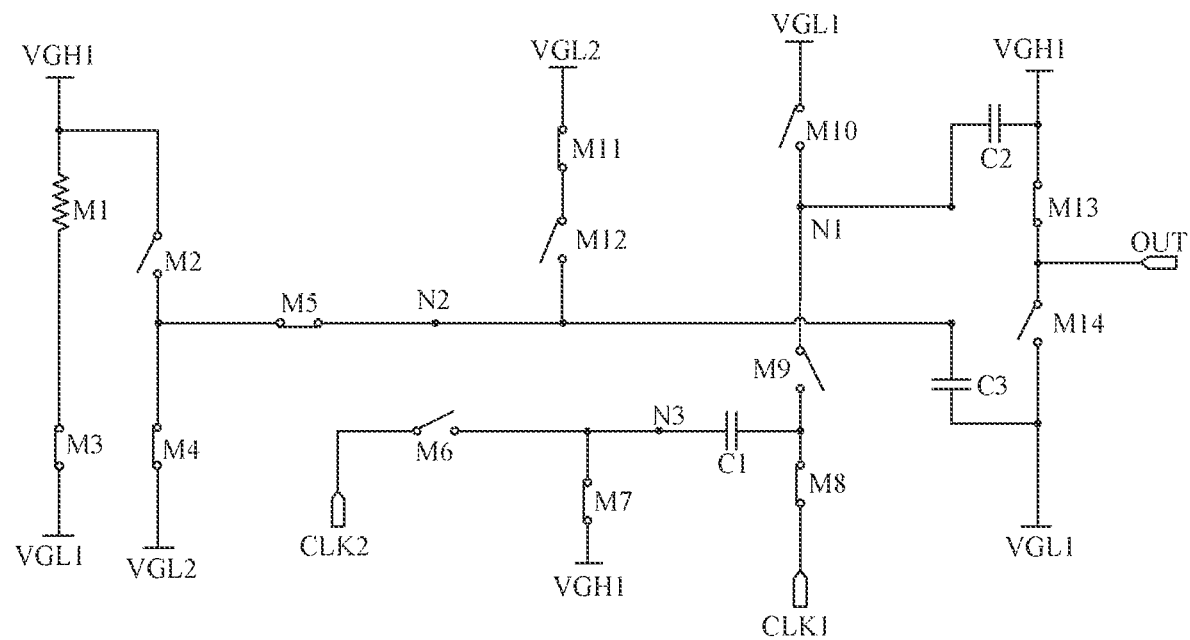
FIG. 4c is a schematic diagram of an equivalent circuit of the shift register shown in FIG. 2 when the shift register operates in a second output sub-stage.

FIG. 4c is a schematic diagram of an equivalent circuit of the shift register shown in FIG. 2 when the shift register operates in the second output sub-stage, and as shown in FIG. 4c, the third transistor M3, the fourth transistor M4, the fifth transistor M5, the seventh transistor M7, the eighth transistor M8, the eleventh transistor M11, and the thirteenth transistor M13 are all turned on, and the second transistor M2, the sixth transistor M6, the ninth transistor M9, the tenth transistor M10, the twelfth transistor M12, and the fourteenth transistor M14 are all turned off.

Since the input signal is in a high level state, the thud transistor M3 and the fourth transistor M4 are turned on, and at this time, the first operating voltage VGL1 is written into the control electrode of the second transistor M2 through the third transistor M3, the second transistor M2 is in an off-state, and the first transistor M1 is equivalent to one resistor.

Since the second clock signal is in a high level state, the fifth transistor M5 and the seventh transistor M7 are turned on, the third operating voltage VGL2 can be written into the second node N2 through the fourth transistor M4 and the fifth transistor M5 in sequence, the voltage at the second node N2 is maintained in the low level state, and the sixth transistor M6, the tenth transistor M10 and the fourteenth transistor M14 are all turned off. The second operating voltage VGH1 is written into the third node N3 through the seventh transistor M7, the voltage at the third node N3 is in a high level state, the eighth transistor M8 and the eleventh transistor M11 are in an on-state, and the first clock signal in a low level state is written into the second terminal of the first capacitor C1 through the eighth transistor M8. Meanwhile, since the first clock signal is in a low level state, the ninth transistor M9 and the twelfth transistor M12 are turned off. Since both the ninth transistor M9 and the tenth transistor M10 are turned off, the first node N1 is in a floating state, and the voltage at the first node N1 is maintained in the previous high level state.

Since the voltage at the first node N1 is in a high level state, and the voltage at the second node N2 is in a low level state, the thirteenth transistor M13 is turned on, the fourteenth transistor M14 is turned off, the second operating voltage VGH1 is written into the signal output terminal OUT through the thirteenth transistor M13, and the signal output terminal OUT continuously outputs a high level signal.

In a final output stage t3, the input signal provided by the signal input terminal STU is in a low level state, the first clock signal provided by the first clock signal terminal CLK1 is in a high level state, and the second clock signal provided by the second clock signal terminal CLK2 is in a low level state.

Figure 4D:
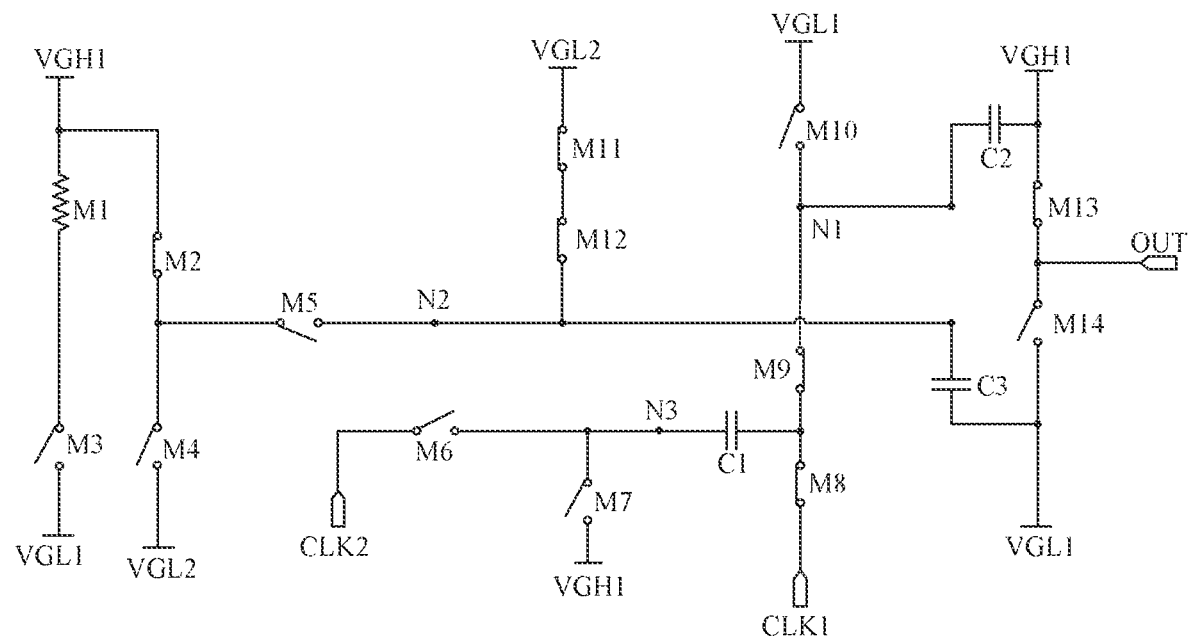
FIG. 4d is a schematic diagram of an equivalent circuit of the shift register shown in FIG. 2 when the shift register operates in a final output stage.

FIG. 4d is a schematic diagram of an equivalent circuit of the shift register shown in FIG. 2 when the shift register operates in the final output stage, and as shown in FIG. 4d, the second transistor M2, the eighth transistor M8, the ninth transistor M9, the eleventh transistor M11, the twelfth transistor M12, and the thirteenth transistor M13 are all turned on, and the third transistor M3, the fourth transistor M4, the fifth transistor M5, the sixth transistor M6, the seventh transistor M7, the tenth transistor M10, and the fourteenth transistor M14 are all turned off.

Since the input signal is in a low level state, the third transistor M3 and the fourth transistor M4 are turned off, and at this time, the second operating voltage VGH1 is written into the control electrode of the second transistor M2 through the first transistor M1, the second transistor M2 is in an on-state, and the second operating voltage VGH1 is written into the first electrode of the fifth transistor M5 through the second transistor M2.

Since the second clock signal is in a low level state, the fifth transistor M5 and the seventh transistor M7 are turned off. The sixth transistor M6 is maintained in a low level state, the third node N3 is in a floating state, and the eighth transistor M8 and the eleventh transistor M11 are maintained in an on-state. Meanwhile, since the first clock signal is in a high level state, the ninth transistor M9 and the twelfth transistor M12 are turned on. Since the eleventh transistor M11 and the twelfth transistor M12 are both turned on, the third operating voltage VGL2 is written into the second node N2 through the eleventh transistor M11 and the twelfth transistor M12, so as to maintain the second node N2 in a low level state all the time, thereby achieving the purpose of reducing noise for the second node N2. Since both the eighth transistor M8 and the ninth transistor M9 are turned on, the first clock signal in a high level state is written into the second terminal of the first capacitor C1 through the eighth transistor M8, and is written into the first node N1 through the ninth transistor M9, and the voltage at the first node N1 is in a high level state.

It should be noted that, at the starting time of the final output stage t3, the first clock signal is switched from a low level state to a high level state, the voltage at the second terminal of the first capacitor C1 is charged from a low level state to a high level state, and since the third node N3 is in a floating state, the voltage at the third node N3 is pulled up to a higher level under the bootstrap effect of the first capacitor C1; and at the end of the final output stage t3, the first clock signal is switched from a high level state to a low level state, and the voltage at the second terminal of the first capacitor C1 is discharged from a high level state to a low level state, so that the voltage at the third node N3 is restored to the original level (which is still in a high level state but has a decreased level) under the bootstrap effect of the first capacitor C1.

Since the voltage at the first node N1 is in a high level state, and the voltage at the second node N2 is in a low level state, the thirteenth transistor M13 is turned on, the fourteenth transistor M14 is turned off, the second operating voltage VGH1 is written into the signal output terminal OUT through the thirteenth transistor M13, and the signal output terminal OUT continuously outputs a high level signal.

It should be noted that, during the period from the end of the final output stage t3 to the starting of the reset stage t4, the voltage at the first node N1 is maintained in a high level state, the voltage at the second node N2 is maintained in a low level state, and the signal output terminal OUT continuously outputs a high level signal.

In the reset stage t4, the input signal provided by the signal input terminal STU is in a low level state, the first clock signal provided by the first clock signal terminal CLK1 is in a low level state, and the second clock signal provided by the second clock signal terminal CLK2 is in a high level state.

Figure 4E:
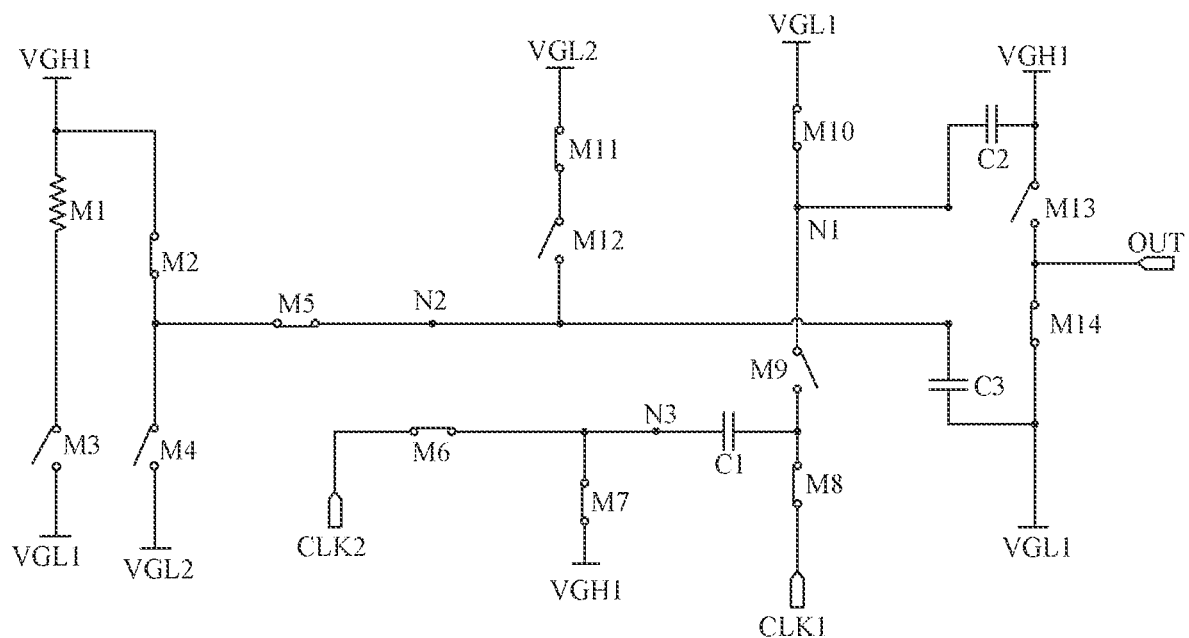
FIG. 4e is a schematic diagram of an equivalent circuit of the shift register shown in FIG. 2 when the shift register operates in a reset stage.

FIG. 4e is a schematic diagram of an equivalent circuit of the shift register shown in FIG. 2 when the shift register operates in the reset stage, and as shown in FIG. 4e, the second transistor M2, the fifth transistor M5, the sixth transistor M6, the seventh transistor M7, the eighth transistor M8, the tenth transistor M10, the eleventh transistor M11, and the fourteenth transistor M14 are all turned on, and the third transistor M3, the fourth transistor M4, the ninth transistor M9, the twelfth transistor M12, and the thirteenth transistor M13 are all turned off.

Since the input signal is in a low level state, the third transistor M3 and the fourth transistor M4 are turned off, and at this time, the second operating voltage VGH1 is written into the control electrode of the second transistor M2 through the first transistor M1, the second transistor M2 is in an on-state, and the second operating voltage VGH1 is written into the first electrode of the fifth transistor M5 through the second transistor M2.

Since the second clock signal is in a high level state, the fifth transistor M5, the seventh transistor M7, and the tenth transistor M10 are all turned on, the second operating voltage VGH1 can be written into the second node N2 through the second transistor M2 and the fifth transistor M5 in sequence, the voltage at the second node N2 is in a high level state, at this time, the sixth transistor M6 is turned on, the second clock signal in a high level state is written into the third node N3 through the sixth transistor M6, the second operating voltage VGH1 is written into the third node N3 through the seventh transistor M7, the voltage at the third node N3 is in a high level state, and the eighth transistor M8 and the eleventh transistor M11 are turned on. In addition, the first operating voltage VGL1 is written into the first node N1 through the tenth transistor M10, and the voltage at the first node N1 is in a low level state; meanwhile, since the first clock signal is in a low level state, the ninth transistor M9 and the twelfth transistor M12 are in an off-state.

Since the voltage at the first node N1 is in a low level state and the voltage at the second node N2 is in a high level state, the thirteenth transistor M13 is turned off, and the fourteenth transistor M14 is turned on, the first operating voltage VGL is written into the signal output terminal OUT through the fourteenth transistor M14, and the signal output terminal OUT outputs a low level signal.

At the end of the reset stage t4, the second clock signal is switched from a high level state to a low level state, and the sixth transistor M6 is maintained in an on-state, so that the second clock signal in a low level state is written into the third node N3 through the sixth transistor M6, and the voltage at the third node N3 is in a low level state.

After the reset stage t4, a holding stage t5 may be further included, in which the input signal provided by the signal input terminal STU is in a low level state, the first clock signal provided by the first clock signal terminal CLK1 is in a high level state, and the second clock signal provided by the second clock signal terminal CLK2 is in a low level state.

Figure 4F:
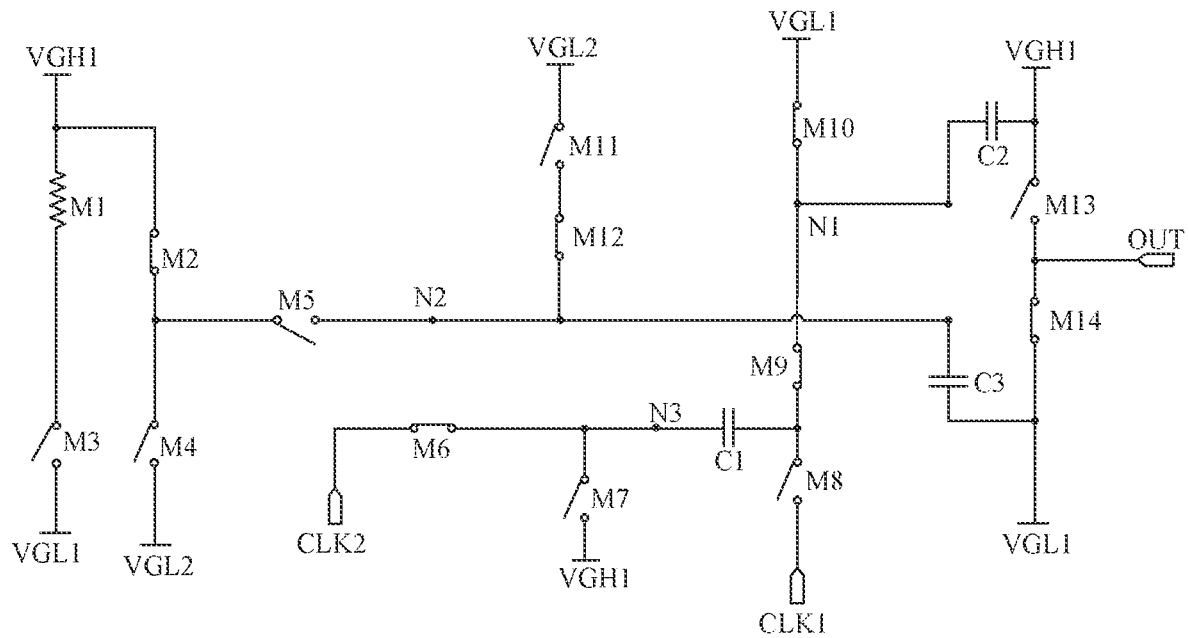
FIG. 4f is a schematic diagram of an equivalent circuit of the shift register shown in FIG. 2 when the shift register operates in a holding stage.

FIG. 4f is a schematic diagram of an equivalent circuit of the shift register shown in FIG. 2 when the shift register operates in the holding stage, and as shown in FIG. 4f, the second transistor M2, the sixth transistor M6, the ninth transistor M9, the tenth transistor M10, the twelfth transistor M12 and the fourteenth transistor M14 are all turned on, and the third transistor M3, the fourth transistor M4, the fifth transistor M5, the seventh transistor M7, the eighth transistor M8, the tenth transistor M10, the eleventh transistor M11 and the thirteenth transistor M13 are all turned off.

Since the input signal is in a low level state, the third transistor M3 and the fourth transistor M4 are turned off, and at this time, the second operating voltage VGH1 is written into the control electrode of the second transistor M2 through the first transistor M1, the second transistor M2 is in an on-state, and the second operating voltage VGH1 is written into the first electrode of the fifth transistor M5 through the second transistor M2.

Since the second clock signal is in a low level state, the fifth transistor M5 and the seventh transistor M7 are turned off. The second node N2 is maintained in the previous high level state, the sixth transistor M6 and the tenth transistor M10 are turned on, the second clock signal in a low level state is written into the second node N2 through the sixth transistor M6 to maintain the second node N2 in a low level state, and the eighth transistor M8 and the eleventh transistor M11 are turned off. Meanwhile, since the first clock signal is in a high level state, the ninth transistor M9 and the twelfth transistor M12 are turned on. Since the tenth transistor M10 is turned on, the first operating voltage VGL1 is written into the first node N1 through the tenth transistor M10, and the first node N1 is in a low level state.

Since the first node N1 is in a low level state and the second node N2 is in a high level state, the thirteenth transistor M13 is turned off, the fourteenth transistor M14 is turned on, the first operating voltage VGL is written into the signal output terminal OUT through the fourteenth transistor M14, and the signal output terminal OUT outputs a low level signal.

Thereafter, the reset stage t4 and the holding stage t5 are alternated until the next operating cycle starts; and in this process, the voltage at the first node N1 is continuously in a low level state, the voltage at the second node N2 is continuously in a high level state, the voltage at the third node N3 is in a high level state in the reset stage t4 but is in a low level state at the end of the reset stage t4, and the output terminal continuously outputs a low level signal.

Figure 5:
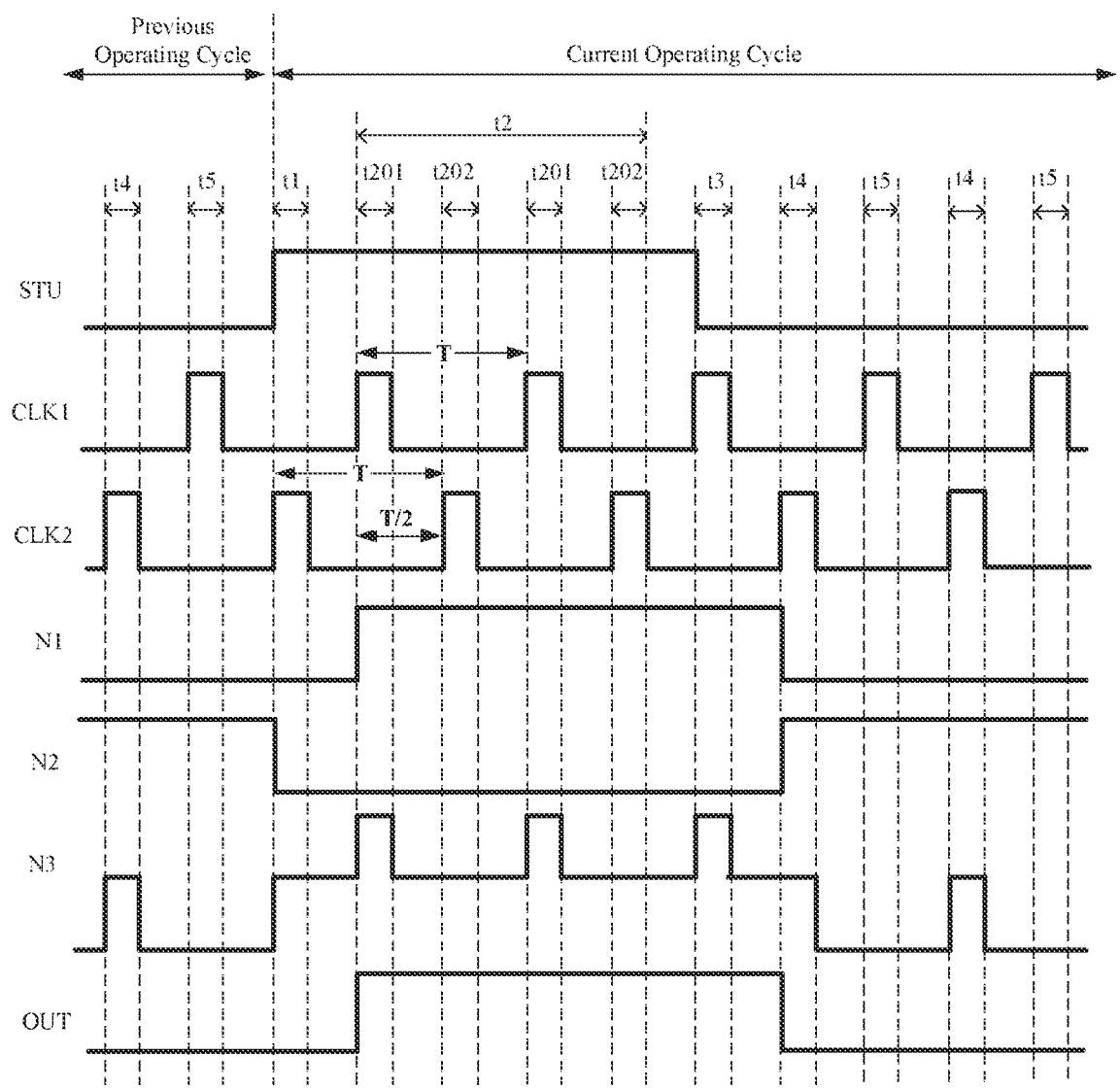
FIG. 5 is another timing diagram illustrating an operation of the shift register shown in FIG. 2.

FIG. 5 is another timing diagram illustrating an operation of the shift register shown in FIG. 2, and as shown in FIG. 5, unlike the operation timing shown in FIG. 3, the duration in which the input signal is in an active level state in FIG. 5 is increased by T, which is the period of the first or second clock signal, compared with the duration in which the input signal is in an active level state in FIG. 3. At this time, the continuous-output stage t2 includes two continuous-output periods, i.e. the entire continuous-output stage t2 includes two first output sub-stages t201 and two second output sub-stages t202. The duration in which the scan driving signal output from the signal output terminal OUT is in an active level state in FIG. 5 is increased by T compared with the duration in which the input signal is in an active level state in FIG. 3.

Figure 6:
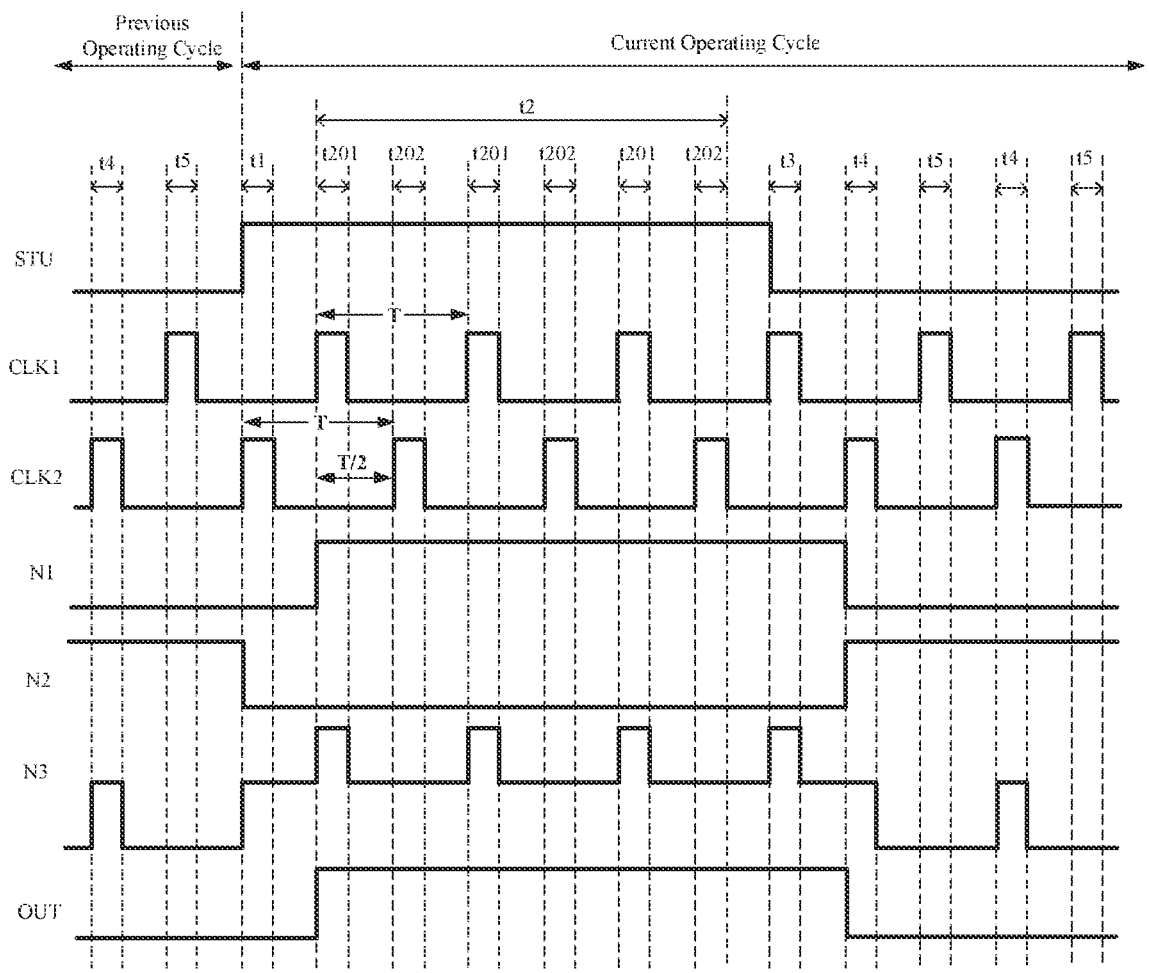
FIG. 6 is another timing diagram illustrating an operation of the shift register shown in FIG. 2.

FIG. 6 is another liming diagram illustrating an operation of the shift register shown in FIG. 2, and as shown in FIG. 6, unlike the operation timing shown in FIG. 3, the duration in which the input signal is in an active level state in FIG. 6 is increased by 2 T, where T is the period of the first or second clock signal, compared with the duration in which the input signal is in an active level state in FIG. 3. At this time, the continuous-output stage t2 includes three continuous-output periods, i.e., the entire continuous-output stage t2 includes three first output sub-stages t201 and three second output sub-stages t202. The duration in which the scan driving signal output from the signal output terminal OUT is in an active level state in FIG. 6 is increased by 2 T compared with the duration in which the input signal is in an active level state in FIG. 3.

For the case that the continuous-output stage t2 includes more than three continuous-output periods, no further example is described here; it should be noted that, in the embodiment of the present disclosure, in each operating cycle, it should be ensured that the time when the input signal is switched from an inactive state to an active level state (i.e., the rising edge in the example) is aligned with the time when the second clock signal is switched from at inactive state to an active level state (i.e., the rising edge in the example); and the lime when the input signal is switched from an active level state to an inactive level state (i.e., the falling edge in the example) is aligned with the time when the first clock signal is switched from an inactive state to an active level state (i.e., the rising edge in the example).

From above it can be seen that, in the embodiment of the present disclosure, the pulse width of the scan driving signal provided to the gate line by the shift register is adjustable, so that the change of the internal compensation time of the pixel circuit can be adapted.

In the embodiment of the present disclosure, all transistors in the shift register may also be P-type transistors, and in this case, the operating process of the shift register is the same as that of the shift register in which the transistors are N-type transistors, which is not described herein again.

Figure 7:
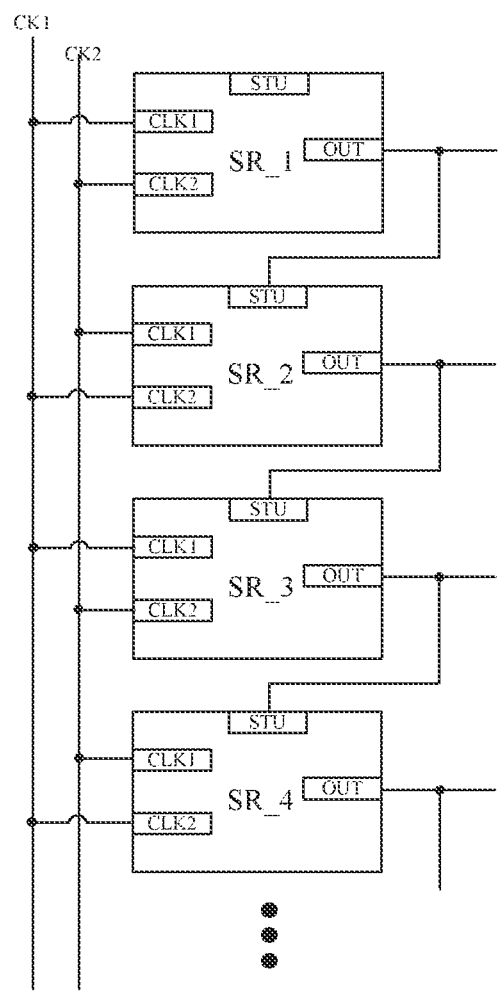
FIG. 7 is a schematic circuit diagram of a gate driving circuit according to an embodiment of the present disclosure.

FIG. 7 is a schematic circuit diagram of a gate driving circuit according to an embodiment of the present disclosure, and as shown in FIG. 7, the gate driving circuit includes a plurality of cascaded shift registers SR_1, SR_2, SR_3 and SR_4, where the shift registers SR_1, SR_2, SR_3 and SR_4 adopt the shift registers provided by the above embodiment. For any of the other stages of shift registers SR_2, SR_3, and SR_4 than the first stage of shift register SR_1, the signal input terminal STU of the shift register SR_2, SR_3, or SR_4 is coupled to the signal output terminal OUT of the previous stage of shift register. It should be noted that FIG. 7 only shows the first four stages of shift registers by way of example.

As an example, two clock signal supply lines are provided for the gate driving circuit: a first clock signal supply line CK1 and a second clock signal supply line CK 2. In the gate driving circuit, the odd-numbered stages of shift registers SR_1 and SR_3 have their first clock signal terminals CLK1 coupled to the first clock signal supply line CK1 and their second clock signal terminals CLK2 coupled to the second clock signal supply line CK 2; and the even-numbered stages of shift registers SR_2 and SR_4 have their first clock signal terminals CLK1 coupled to the second clock signal supply line CK2 and their second clock signal terminals CLK2 coupled to the first clock signal supply line CK 1.

In the existing art, each stage of shift register in the gate driving circuit is configured with a signal input terminal and a reset signal terminal; and the reset signal terminal is coupled with control electrodes of transistors in the shift register and is configured to control the reset process on the voltages at the first node/the second node in the shift register. Generally, the reset signal terminal of the current stage of shift register is coupled to the signal output terminal of the next stage of shift register. Therefore, in the existing art, two signal lines are required to be disposed in each stage of shift registers except for the first and last stages of shift registers, where one signal line is configured to couple the signal input terminal STU of the current stage of shift register and the signal output terminal of the previous stage of shift register, and the other signal line is configured to couple the reset signal terminal of the current stage of shift register and the signal output terminal of the next stage of shift register.

In the embodiment of the present disclosure, the reset process on the voltages at the first node N1/the second node N2 in each stage of the shift registers is controlled by the first clock signal terminal CLK1 and the second clock signal terminal CLK2, and the shift registers do not need to be configured with the reset signal terminal, so that each stage of the shift register except for the first and last stages of shift registers only needs to be configured with one signal line for coupling the signal input terminal STU of the current stage of shift register and the signal output terminal OUT of the previous stage of shift register. Compared with the existing art, the embodiment of the present disclosure can effectively reduce the number of signal lines, thereby reducing the overall size of the gate driving circuit and being beneficial to the narrow bezel design of the display device.

Figure 8:
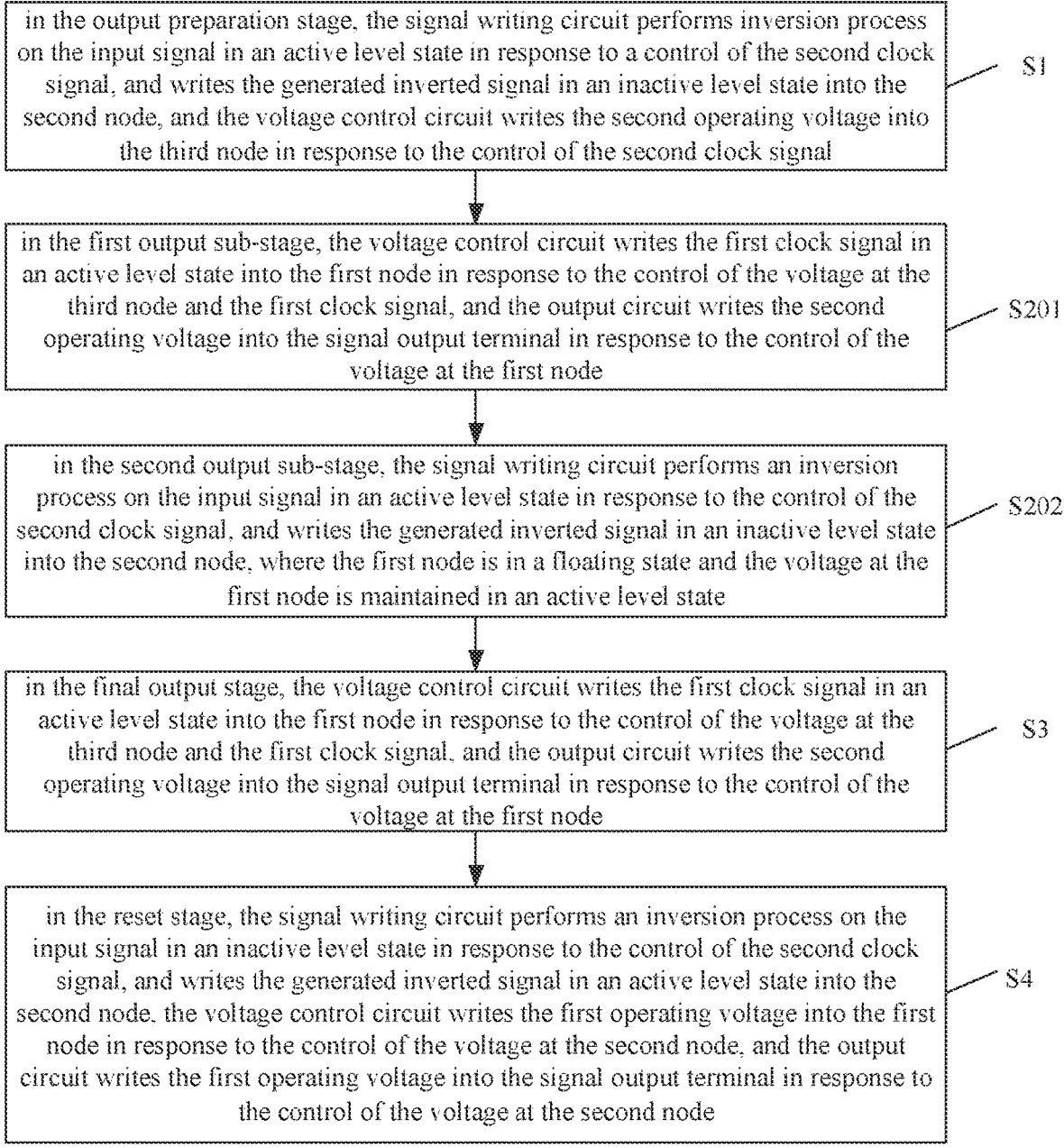
FIG. 8 is a flowchart illustrating a gate driving method according to an embodiment of the present disclosure.

FIG. 8 is a flowchart illustrating a gate driving method according to an embodiment of the present disclosure, and as shown in FIG. 8, the gate driving method is based on the shift register provided in the above embodiment, find the gate driving method includes steps S1 to S4.

In step S1, in the output preparation stage, the signal writing circuit inverts the input signal in an active level state in response to a control of the second clock signal, and writes the generated inverted signal in an inactive level state into the second node, and the voltage control circuit writes the second operating voltage into the third node in response to the control of the second clock signal.

Step S2 corresponds to the continuous-output stage, and includes step S201 and step S202.

In the continuous-output stage, the continuous-output stage includes at least one continuous-output period, and the continuous-output period includes a first output sub-stage and a second output sub-stage.

In step S201, in the first output sub-stage, the voltage control circuit writes the first clock signal in an active level state into the first node in response to the control of the voltage at the third node and the first clock signal, and the output circuit writes the second operating voltage into the signal output terminal in response to the control of the voltage at the first node.

In step S202, in the second output sub-stage, the signal writing circuit inverts the input signal in an active level state in response to the control of the second clock signal, and writes the generated inverted signal in an inactive level state into the second node, where the first node is in a floating state and the voltage at the first node is maintained in an active level state.

In step S3, in the final output stage, the voltage control circuit writes the first clock signal in an active level state into the first node in response to the control of the voltage at the third node and the first clock signal, and the output circuit writes the second operating voltage into the signal output terminal in response to the control of the voltage at the first node.

In step S4, in the reset stage, the signal writing circuit inverts the input signal in an inactive level state in response to the control of the second clock signal, and writes the generated inverted signal in an active level state into the second node, the voltage control circuit writes the first operating voltage into the first node in response to the control of the voltage at the second node, and the output circuit writes the first operating voltage into the signal output terminal in response to the control of the voltage at the second node.

For the detailed descriptions of the above steps S1 to S4, reference may be made to the description of the operating process of the shift register in the above embodiments, and details are not repeated here.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

What is claimed is:

1. A shift register, comprising a signal writing circuit, a voltage control circuit, and an output circuit, the voltage control circuit and the output circuit being coupled to a first node, and the signal writing circuit, the voltage control circuit and the output circuit being coupled to a second node, wherein the signal writing circuit is configured to write an inverted signal of an input signal provided by a signal input terminal into the second node in response to a control of a second clock signal provided by a second clock signal terminal;

the voltage control circuit comprises a first control circuit and a second control circuit, the first control circuit comprises a sixth transistor and a seventh transistor, a control electrode of the sixth transistor is coupled to the second node, a first electrode of the sixth transistor is coupled to the second clock signal terminal, and a second electrode of the sixth transistor is coupled to a third node, a control electrode of the seventh transistor is coupled to the second clock signal terminal, a first electrode of the seventh transistor is coupled to the third node, and a second electrode of the seventh transistor is coupled to a second power supply terminal, the second control circuit comprises a first capacitor, an eighth transistor, a ninth transistor, and a tenth transistor, a first terminal of the first capacitor is coupled to a control electrode of the eighth transistor, and a second terminal of the first capacitor is coupled to the first electrode of the eighth transistor and a second electrode of the ninth transistor, a second electrode of the eighth transistor is coupled to a first clock signal terminal, a control electrode of the ninth transistor is coupled to the first clock signal terminal, and a first electrode of the ninth transistor is coupled to the first node, a control electrode of the tenth transistor is coupled to the second node, and a first electrode of the tenth transistor is coupled to a first power supply terminal, the second power supply terminal supplies an active-level voltage, and the first power supply terminal supplies an inactive-level voltage; and the output circuit comprises a thirteenth transistor and a fourteenth transistor, a control electrode of the thirteenth transistor is coupled to the first node, a first electrode of the thirteenth transistor is coupled to the second power supply terminal, and a second electrode of the thirteenth transistor is coupled to a signal output terminal, a control electrode of the fourteenth transistor is coupled to the second node, a first electrode of the fourteenth transistor is coupled to the signal output terminal, and a second electrode of the fourteenth transistor is coupled to the first power supply terminal, wherein all transistors in the shift register are N-type transistors, or all transistors in the shift register are P-type transistors.

2. The shift register of claim 1, wherein the signal writing circuit comprises an inverter circuit and a write control circuit;

the inverter circuit is coupled to the signal input terminal, and is configured to invert the input signal provided by the signal input terminal and output the inverted signal; and the write control circuit is coupled to the inverter circuit, and is configured to write the inverted signal to the second node in response to the control of the second clock signal.

3. The shift register of claim 2, wherein the inverter circuit comprises a first transistor, a second transistor, a third transistor, and a fourth transistor;

a control electrode and a first electrode of the first transistor are coupled to the second power supply terminal, and a second electrode of the first transistor is coupled to a control electrode of the second transistor and a first electrode of the third transistor;

a first electrode of the second transistor is coupled to the second power supply terminal, and a second electrode of the second transistor is coupled to a first electrode of the fourth transistor;

a control electrode of the third transistor is coupled to the signal input terminal, and a second electrode of the third transistor is coupled to the first power supply terminal; and a control electrode of the fourth transistor is coupled to the signal input terminal, a first electrode of the fourth transistor is coupled to the write control circuit, and a second electrode of the fourth transistor is coupled to a third power supply terminal.

4. The shift register of claim 2, wherein the write control circuit comprises a fifth transistor;

a control electrode of the fifth transistor is coupled to the second clock signal terminal, a first electrode of the fifth transistor is coupled to the inverter circuit, and a second electrode of the fifth transistor is coupled to the second node.

5. The shift register of claim 1, further comprising a regulator circuit, wherein the regulator circuit is coupled to the second node and the third node, and is configured to write a third operating voltage provided by a third power supply terminal into the second node in response to the control of the voltage at the third node and the first clock signal.

6. The shift register of claim 5, wherein the regulator circuit comprises an eleventh transistor and a twelfth transistor;

a control electrode of the eleventh transistor is coupled to the third node, a first electrode of the eleventh transistor is coupled to the third power supply terminal, and a second electrode of the eleventh transistor is coupled to a first electrode of the twelfth transistor; and a control electrode of the twelfth transistor is coupled to the first clock signal terminal, and a second electrode of the twelfth transistor is coupled to the second node.

7. The shift register of claim 1, wherein the output circuit further comprises a second capacitor and a third capacitor;

a first terminal of the second capacitor is coupled to the first node, and a second terminal of the second capacitor is coupled to the second power supply terminal; and a first terminal of the third capacitor is coupled to the second node, and a second terminal of the third capacitor is coupled to the first power supply terminal.

8. The shift register of claim 5, wherein the regulator circuit comprises an eleventh transistor and a twelfth transistor;

a control electrode of the eleventh transistor is coupled to the third node, a first electrode of the eleventh transistor is coupled to the second node, and a second electrode of the eleventh transistor is coupled to a first electrode of the twelfth transistor; and a control electrode of the twelfth transistor is coupled to the first clock signal terminal, and a second electrode of the twelfth transistor is coupled to the third power supply terminal.

9. The shift register of claim 3, wherein the first power supply terminal and the third power supply terminal are a same power supply terminal.

10. The shift register of claim 5, wherein the first power supply terminal and the third power supply terminal are a same power supply terminal, and the first operating voltage and the third operating voltage are a same voltage.

11. A gate driving circuit, comprising:
a plurality of cascaded shift registers, each of the plurality of cascaded shift registers being the shift register according to claim 1,
wherein the signal input terminal of any of other stages of shift registers than a first stage of shift register among the plurality of cascaded shift registers is coupled to the signal output terminal of a previous stage of shift register.

12. A gate driving method, wherein the gate driving method is based on the shift register according to claim 1, and the gate driving method comprises:
in an output preparation stage, inverting the input signal in an active level state by the signal writing circuit in response to the control of the second clock signal, writing, by the signal writing circuit, a generated inverted signal in an inactive level state into the second node, and writing, by the voltage control circuit, the second operating voltage into the third node in response to the control of the second clock signal;
in a continuous-output stage comprising at least one continuous-output period which comprises a first output sub-stage and a second output sub-stage,
in the first output sub-stage, writing, by the voltage control circuit, the first clock signal in an active level state into the first node in response to the control of the voltage at the third node and the first clock signal, and writing, by the output circuit, the second operating voltage into the signal output terminal in response to the control of the voltage at the first node;
in the second output sub-stage, inverting the input signal in an active level state by the signal writing circuit in response to the control of the second clock signal, and writing, by the signal writing circuit, a generated inverted signal in an inactive level state into the second node, where the first node is in a floating state and the voltage at the first node is maintained in an active level state;
in a final output stage, writing, by the voltage control circuit, the first clock signal in an active level state into the first node in response to the control of the voltage at the third node and the first clock signal, and writing, by the output circuit, the second operating voltage into the signal output terminal in response to the control of the voltage at the first node; and
in a reset stage, inverting the input signal in an inactive level state by the signal writing circuit in response to the control of the second clock signal, and writing, by the signal writing circuit, a generated inverted signal in an active level state into the second node, writing, by the voltage control circuit, the first operating voltage into the first node in response to the control of the voltage at the second node, and writing, by the output circuit, the first operating voltage into the signal output terminal in response to the control of the voltage at the second node.

* * * * *